(12) United States Patent
Jin et al.

(10) Patent No.: US 10,854,853 B2
(45) Date of Patent: Dec. 1, 2020

(54) FLEXIBLE OLED DISPLAY AND METHOD FOR MANUFACTURING THE SAME

(71) Applicant: WUHAN CHINA STAR OPTOELECTRONICS TECHNOLOGY CO., LTD., Wuhan (CN)

(72) Inventors: Jiangjiang Jin, Wuhan (CN); Hsianglun Hsu, Wuhan (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 15/572,788

(22) PCT Filed: Jun. 22, 2017

(86) PCT No.: PCT/CN2017/089614
§ 371 (c)(1),
(2) Date: Nov. 9, 2017

(87) PCT Pub. No.: WO2018/205363
PCT Pub. Date: Nov. 15, 2018

(65) Prior Publication Data
US 2020/0083487 A1    Mar. 12, 2020

(30) Foreign Application Priority Data
May 12, 2017  (CN) .......................... 2017 1 0335290

(51) Int. Cl.
*H01L 51/56*   (2006.01)
*H01L 51/00*   (2006.01)
*H01L 51/50*   (2006.01)

(52) U.S. Cl.
CPC .......... *H01L 51/56* (2013.01); *H01L 51/0097* (2013.01); *H01L 51/502* (2013.01)

(58) Field of Classification Search
None
See application file for complete search history.

(56) References Cited

U.S. PATENT DOCUMENTS 10,103,359 B2 * 10/2018 Ramadas .............. H05B 33/04
2009/0278449 A1    11/2009 Choi et al.
(Continued)

FOREIGN PATENT DOCUMENTS

| CN | 101577289 A | 11/2009 |
| CN | 103872069 A | 6/2014 |
| CN | 104039544 A | 9/2014 |
| CN | 104576959 A | 9/2015 |

OTHER PUBLICATIONS

Lai, Yawen, et al. "Highly Transparent Thermal Stable Silicone/Titania Hybrids with High Refractive Index for LED Encapsulation." Journal of Coatings Technology and Research, vol. 12, No. 6, 2015, pp. 1185-1192., doi:10.1007/s11998-015-9681-4. (Year: 2015).*

(Continued)

*Primary Examiner* — J. E. Schoenholtz
(74) *Attorney, Agent, or Firm* — Soroker Agmon Nordman

(57) ABSTRACT

A flexible organic light-emitting diode (OLED) display and a method for manufacturing the same are provided. The method includes: forming an organic light-emitting display layer on a flexible substrate; coating a nanocomposite material on the organic emitting display layer to form a nanocomposite layer; and forming a first inorganic layer on the nanocomposite layer. The nanocomposite material is obtained by modifying surfaces of a plurality of nanoparticles with oleyl phosphate and then dispersing the modified nanoparticles in an organic monomer.

17 Claims, 3 Drawing Sheets

(56) References Cited

U.S. PATENT DOCUMENTS

| | | | |
|---|---|---|---|
| 2011/0132449 A1* | 6/2011 | Ramadas | H05B 33/04 |
| | | | 136/256 |
| 2014/0166995 A1 | 6/2014 | Lee et al. | |
| 2015/0102326 A1 | 4/2015 | An | |
| 2016/0149163 A1* | 5/2016 | Chen | G02B 3/0087 |
| | | | 257/40 |
| 2016/0204373 A1* | 7/2016 | Park | H01L 27/3244 |
| | | | 257/40 |
| 2016/0301032 A1* | 10/2016 | Wang | H01L 51/0034 |
| 2017/0145191 A1* | 5/2017 | Kanasashi | C08K 9/04 |
| 2019/0027414 A1 | 1/2019 | Ramadas et al. | |
| 2019/0088838 A1* | 3/2019 | Domann | H01L 33/486 |
| 2019/0211219 A1* | 7/2019 | Kondo | C09D 11/101 |
| 2019/0363290 A1* | 11/2019 | Watanabe | H05B 33/10 |

OTHER PUBLICATIONS

Definition of 'on' downloaded from URL<https://www.merriam-webster.com/dictionary/on> on Apr. 19, 2020 (Year: 2020).*

Kuo, M.-S., Chang, S.-J., Hsieh, P.-H., Huang, Y.-C. and Li, C.-C. (2016), Efficient Dispersants for TiO2 Nanopowder in Organic Suspensions. J. Am. Ceram. Soc., 99: 445-451. doi:10.1111/jace. 14009. (Year: 2016).*

Hidehiro Kamiya and Motoyuki Iijima 2010 Sci. Technol. Adv. Mater. 11 044304 (Year: 2010).*

Dumitrescu, Lucia & Manciulea, Ileana. (2009). Nanocomposite Materials Based on Polymers and Alumina Nanoparticles. 953-956. (Year: 2009).*

* cited by examiner

FLEXIBLE OLED DISPLAY AND METHOD FOR MANUFACTURING THE SAME

FIELD OF THE DISCLOSURE

The present disclosure relates to the field of displays, and more particularly to a flexible organic light-emitting diode (OLED) display and a method for manufacturing the same.

BACKGROUND

OLED displays are used as a next-generation apparatus for carrying out illumination and display. However, due to water and oxygen entering, the lifetime thereof is short.

Since water and oxygen entering generally increases speed of oxidation and crystallization of organic materials, it promotes formation and expansion of dark spots and influences stability of the devices, thus shortening lifetime of the devices. Therefore, researching of encapsulating the organic light-emitting devices is trending. In particular, for OLED in flexible electronics, there is a higher standard for encapsulation.

Currently, organic light-emitting devices are encapsulated with an inorganic material (such as $Al_2O_3$, $SiO_2$, SiNx, etc.), which is deposited and used as an isolation layer. While these deposited inorganic materials exhibit acceptable isolation from water and oxygen, it is easy for these materials to form porous or linear defects therein. These defects gradually expand as time goes by and, thus, inevitably lower reliability of the encapsulating layer.

Therefore, to solve the problems encountered by the prior art, it is required to provide a flexible OLED display and a method for manufacturing the same.

SUMMARY OF THE DISCLOSURE

An object of the present disclosure is to provide a flexible organic light-emitting diode (OLED) display and a method for manufacturing the same, where reliability of the encapsulating layer increases, and lifetime of the products lengthens.

To solve the problems encountered in the prior art, the present disclosure provides a method for manufacturing a flexible OLED display, comprising:

forming an organic light-emitting display layer on a flexible substrate;

coating a nanocomposite material on the organic light-emitting display layer to form a nanocomposite layer, wherein the nanocomposite material is obtained by modifying surfaces of a plurality of nanoparticles with oleyl phosphate and then dispersing the modified nanoparticles in an organic monomer;

forming a first inorganic layer on the nanocomposite layer;

forming an organic layer on the first inorganic layer; and
forming a second inorganic layer on the organic layer;

wherein the organic monomer includes at least one monomer selected from cyclic olefin, acrylic, epoxy, and silicon-based organic monomer.

In the method for manufacturing a flexible OLED display according to the present disclosure, the nanoparticles include metal oxide or non-metal oxide.

In the method for manufacturing a flexible OLED display according to the present disclosure, the nanocomposite layer has a thickness ranging from 10 nm to 100 μm.

In the method for manufacturing a flexible OLED display according to the present disclosure, the organic layer includes at least one material selected from acrylate, hexamethyldisiloxane, polyacrylate, polycarbonate, and polystyrene.

In the method for manufacturing a flexible OLED display according to the present disclosure, the organic layer has thickness ranging from 1 μm to 20 μm.

In the method for manufacturing a flexible OLED display according to the present disclosure, the first inorganic layer has a thickness ranging from 100 nm to 2 μm.

In the method for manufacturing a flexible OLED display according to the present disclosure, the first inorganic layer includes at least one material selected from zircoaluminate, graphene, aluminum oxide, zirconium dioxide, zinc peroxide, silicon nitride, SiCN, SiOx, titanium dioxide, diamond-like carbon.

To solve the problems encountered in the prior art, the present disclosure provides a method for manufacturing a flexible OLED display, comprising:

forming an organic light-emitting display layer on a flexible substrate;

coating a nanocomposite material on the organic light-emitting display layer to form a nanocomposite layer, wherein the nanocomposite material is obtained by modifying surfaces of a plurality of nanoparticles with oleyl phosphate and then dispersing the modified nanoparticles in an organic monomer; and forming a first inorganic layer on the nanocomposite layer.

In the method for manufacturing a flexible OLED display according to the present disclosure, the organic monomer includes at least one monomer selected from cyclic olefin, acrylic, epoxy, and silicon-based organic monomer.

In the method for manufacturing a flexible OLED display according to the present disclosure, the nanoparticles include metal oxide or non-metal oxide.

In the method for manufacturing a flexible OLED display according to the present disclosure, the nanocomposite layer has a thickness ranging from 10 nm to 100 μm.

In the method for manufacturing a flexible OLED display according to the present disclosure, the method further comprises:

forming an organic layer on the first inorganic layer; and
forming a second inorganic layer on the organic layer.

In the method for manufacturing a flexible OLED display according to the present disclosure, the organic layer includes at least one material selected from acrylate, hexamethyldisiloxane, polyacrylate, polycarbonate, and polystyrene.

In the method for manufacturing a flexible OLED display according to the present disclosure, the organic layer has thickness ranging from 1 μm to 20 μm.

In the method for manufacturing a flexible OLED display according to the present disclosure, the first inorganic layer has a thickness ranging from 100 nm to 2 μm.

In the method for manufacturing a flexible OLED display according to the present disclosure, the first inorganic layer includes at least one material selected from zircoaluminate, graphene, aluminum oxide, zirconium dioxide, zinc peroxide, silicon nitride, SiCN, SiOx, titanium dioxide, diamond-like carbon.

Further, the present disclosure provides a flexible OLED display, comprising:

a flexible substrate;

an organic light-emitting display layer disposed on the flexible substrate;

a nanocomposite layer disposed on the organic light-emitting display layer; wherein the nanocomposite layer includes a material obtained by modifying surfaces of a plurality of nanoparticles with oleyl phosphate and then dispersing the modified nanoparticles in an organic monomer; and a first inorganic layer disposed on the nanocomposite layer.

In the flexible OLED display according to the present disclosure, the organic monomer includes at least one monomer selected from cyclic olefin, acrylic, epoxy, and silicon-based organic monomer.

In the flexible OLED display according to the present disclosure, the nanoparticles include metal oxide or non-metal oxide.

In the flexible OLED display according to the present disclosure, the nanocomposite layer has a thickness ranging from 10 nm to 100 μm.

The present disclosure provides a flexible OLED display and a method for manufacturing the same. The nanocomposite, material with good stability is formed by modifying surfaces of the nanoparticles with oleyl phosphate and then dispersing the modified nanoparticles in an organic monomer. Once the nanocomposite material is coated on the organic light-emitting display layer, the nanocomposite material is liquid and thus has good flowability to make surface thereof smoother. Therefore, reliability of the encapsulating layer increases, and lifetime of the products lengthens.

DETAILED DESCRIPTION

Figure 1:
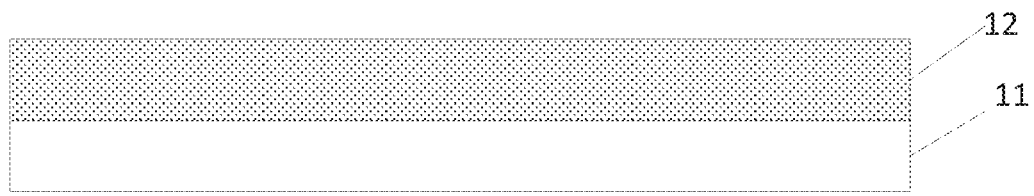
FIG. 1 is a schematic diagram showing a first step of a method for manufacturing a flexible OLED display according the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Please refer to FIG. 1. FIG. 1 is a schematic diagram showing a first step of a method for manufacturing a flexible OLED display according the present disclosure.

The method for manufacturing a flexible OLED display according the present disclosure comprises the following steps.

In step S101, an organic light-emitting display layer is formed on a flexible substrate.

As shown in FIG. 1, an organic light-emitting display layer 12 is formed on a flexible substrate 11. The organic light-emitting display layer 12 has a plurality of organic light-emitting units. The organic light-emitting display layer 12 includes an anode, a hole transport layer, a hole injection layer, a light-emitting layer, an electron transport layer, an electron injection layer, and a cathode.

In step S102, a nanocomposite material is coated on the flexible substrate to form a nanocomposite layer.

Figure 2:
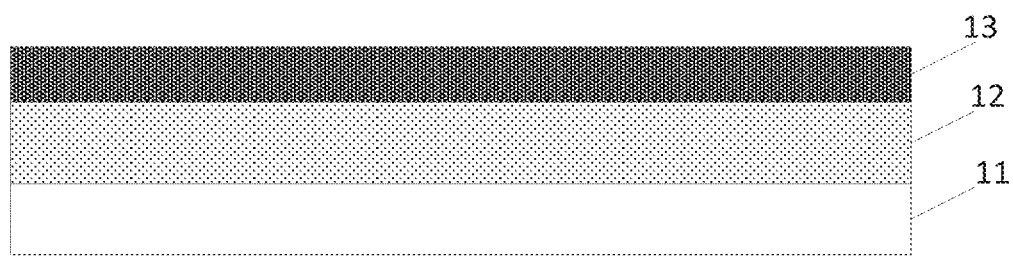
FIG. 2 is a schematic diagram showing a second step of a method for manufacturing a flexible OLED display according the present disclosure.

As shown in FIG. 2, the nanocomposite material is obtained by modifying surfaces of a plurality of nanoparticles with oleyl phosphate and then dispersing the modified nanoparticles in an organic monomer. The organic monomer includes at least one monomer selected from cyclic olefin, acrylic, epoxy, and silicon-based organic monomer. The nanoparticles include metal oxide or non-metal oxide.

Figure 3:
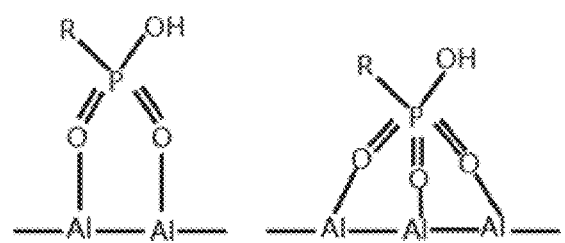
FIG. 3 is a schematic diagram showing formation of coordination bonds between aluminum (Al) element and oxygen (O) element of phosphate ester in the second step of a method for manufacturing a flexible OLED display according the present disclosure.
Figure 4:
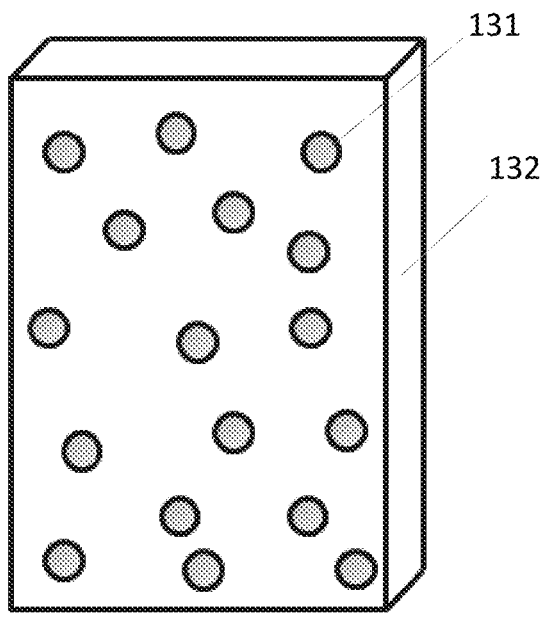
FIG. 4 is a schematic diagram showing the nanoparticles of FIG. 3 which are dispersed in the organic monomer.

Now, $Al_2O_3$ used as the nanoparticles is taken as an example to explain this step. As shown in FIG. 3, surfaces of the nanoparticles are modified with oleyl phosphate ($C_{18}H_{37}O_4P$). In this way, coordination bonds are formed between aluminum (Al) element and oxygen (O) element of phosphate ester. As shown in FIG. 4, the modified nanoparticles 131 are then dispersed in the organic monomer 132 including cyclic olefin, acrylic, epoxy, or silicon-based organic monomer to make the nanoparticles stably dispersed in the organic material.

Thereafter, the above nanocomposite material is coated on the organic light-emitting display layer 12 by any one of the techniques of ink jet printing (IJP), slot coating, spin-coating, and dispensing. Finally, after a low temperature thermal curing or UV curing is performed therefor, a nanocomposite layer 13 is obtained.

The nanocomposite layer has a thickness ranging from 10 nm to 100 μm. Because the thickness thereof falls within this range, the surface of the OLED display is smooth without increasing thickness of the display.

Since the nanocomposite material is liquid and has good flowability, the pixel defining layer can be filled with the nanocomposite material, the surface of the OLED display is smooth, and an inorganic layer can be formed uniformly later thereon. Additionally, the nanocomposite material 13 has a higher index of refraction which is greater than 1.8, therefore the light extraction efficiency can be increased.

In step S103, a first inorganic layer is formed on the nanocomposite layer.

Figure 5:
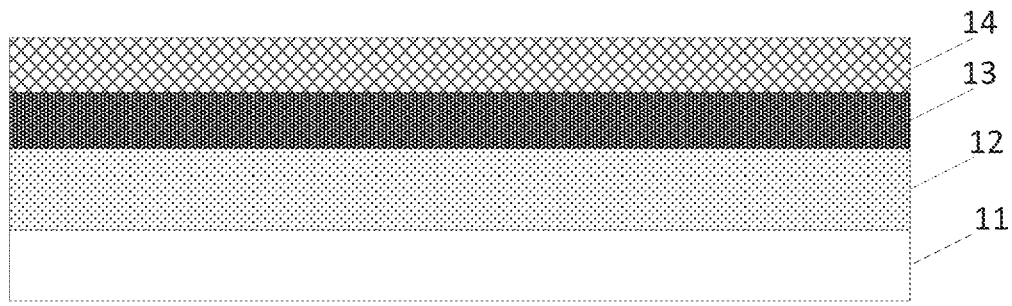
FIG. 5 is a schematic diagram showing a third step of a method for manufacturing a flexible OLED display according the present disclosure.

As shown in FIG. 5, an inorganic material is coated by any one of the techniques of atomic layer deposition (ALD), pulsed laser deposition (PLD), and plasma enhanced chemical vapor deposition (PECVD) on the nanocomposite layer 13 to form a first inorganic layer 14.

The first inorganic layer 14 has a thickness ranging from 100 nm to 2 μm. Because the thickness thereof falls within this range, the effect of isolation from outer water and oxygen is better without increasing thickness of the display.

The first inorganic layer 14 includes at least one material selected from zircoaluminate (ZrAlxOy), graphene, aluminum oxide ($Al_2O_3$), zirconium dioxide ($ZrO_2$), zinc peroxide ($ZnO_2$), silicon nitride (SiNx), SiCN, SiOx, titanium dioxide ($TiO_2$), diamond-like carbon (DLC). Since these materials are not dissolvable in water and do not react with oxygen and have superior erosion resistance, the first inorganic layer 14 has good water and oxygen isolation properties, so that the OLED display can be prevented from erosion.

In step S104, an organic layer is formed on the first inorganic layer.

Figure 6:
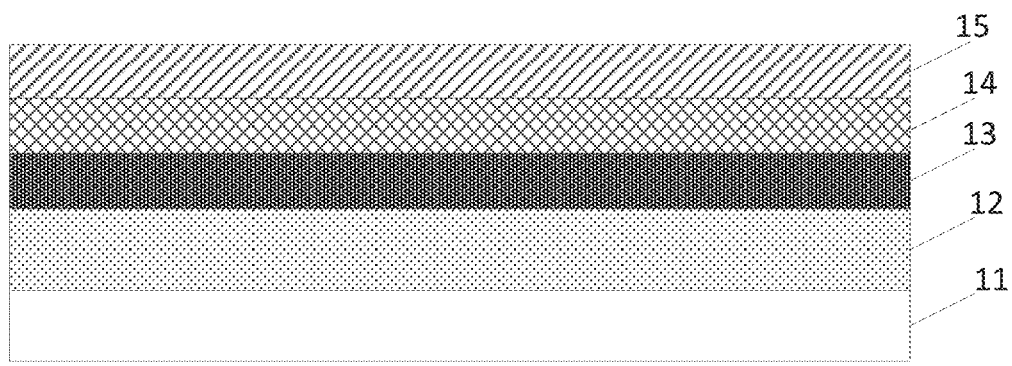
FIG. 6 is a schematic diagram showing a fourth step of a method for manufacturing a flexible OLED display according the present disclosure.

As shown in FIG. 6, an organic material is coated by any one of the techniques of PECVD, IJP, slot coating, spin-coating, and dispensing on the first inorganic layer 14 to form an organic layer 15. The organic layer 15 is used as a buffer to absorb stress caused by bending or folding and is configured to block outer particulate pollutants.

The organic layer 15 has thickness ranging from 1 μm to 20 μm. Because the thickness thereof falls within this range, protection effect of the organic light-emitting display layer is excellent without increasing thickness of the display.

The organic layer 15 is made of a material not limited to acrylate, hexamethyldisiloxane (HDMSO), polyacrylate, polycarbonate, and polystyrene.

In step S105, a second inorganic layer is formed on the organic layer.

Figure 7:
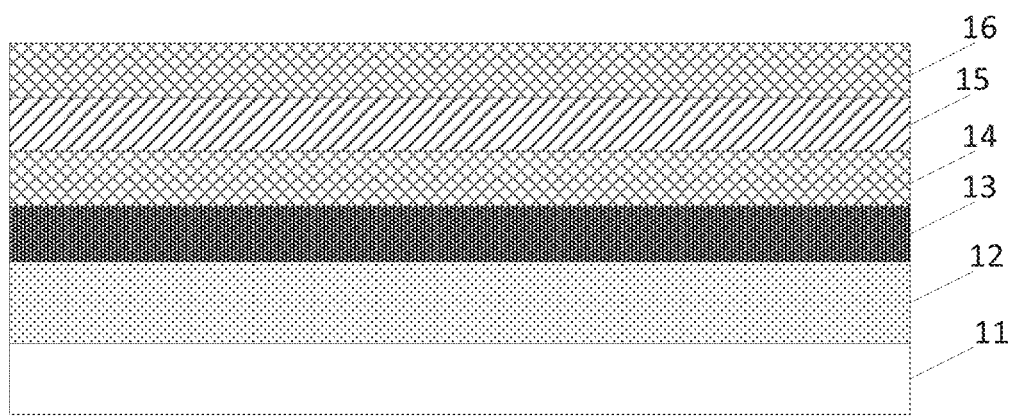
FIG. 7 is a schematic diagram showing a fifth step of a method for manufacturing a flexible OLED display according the present disclosure.

As shown in FIG. 7, an inorganic material is deposited by any one of the techniques of PECVD, ALD, PLD, and Sputter on the organic layer 15 to form a second inorganic layer 16. The second inorganic layer 16 is produced by a process the same as and has a thickness identical to the first inorganic layer 14.

According to the embodiment, the present disclosure provides a flexible organic light-emitting diode (OLED) display, comprising: a flexible substrate 11; an organic light-emitting display layer 12; a nanocomposite layer 13; and a first inorganic layer 14. The organic light-emitting display layer 12 is disposed on the flexible substrate 11. The nanocomposite layer 13 is disposed on the organic light-emitting display layer 12. The nanocomposite layer includes a material obtained by modifying surfaces of a plurality of nanoparticles with oleyl phosphate and then dispersing the modified nanoparticles in an organic monomer. The first inorganic layer 14 is disposed on the nanocomposite layer 13.

Moreover, the flexible OLED display further includes an organic layer 15 and a second inorganic layer 16. The organic layer 15 is disposed on the first inorganic layer 14. The second inorganic layer 16 is disposed on the organic layer 15.

The nanocomposite material with good stability is formed by modifying surfaces of the nanoparticles with oleyl phosphate and then dispersing the modified nanoparticles in an organic monomer such as cyclic olefin, acrylic, epoxy, or silicon-based organic monomer. Such nanocomposite material can be further cured by low temperature thermal curing or UV curing to form a homogeneously transparent film. Also, it has an index of refraction which is greater than 1.8. With the nanocomposite material coated on the organic light-emitting display layer, the light extraction efficiency can be increased significantly. Additionally, such nanocomposite material has good flowability, and therefore the pixel defining layer can be filled with the nanocomposite material, and an inorganic layer with excellent isolation from water and hydrogen can be formed uniformly later thereon. Reliability of encapsulation increases, and lifetime of the OLED lengthens.

The present disclosure provides a flexible OLED display and a method for manufacturing the same. The nanocomposite material with good stability is formed by modifying surfaces of the nanoparticles with oleyl phosphate and then dispersing the modified nanoparticles in an organic monomer. Once the nanocomposite material is coated on the organic light-emitting display layer, the nanocomposite material is liquid and thus has good flowability to make surface thereof smoother. Therefore, reliability of the encapsulating layer increases, and lifetime of the products lengthens.

In summary, while the present disclosure has been described with the aforementioned preferred embodiments, it is preferable that the specifications relating to the above embodiments should be construed as exemplary rather than as limiting of the present disclosure. One of ordinary skill in the art can make a variety of modifications and variations without departing from the spirit and scope of the present disclosure as defined by the following claims.

What is claimed is:

1. A method for manufacturing a flexible organic light-emitting diode (OLED) display, comprising:
   forming an organic light-emitting display layer on a flexible substrate;
   coating a nanocomposite material on the organic light-emitting display layer to form a nanocomposite layer, wherein the nanocomposite material is obtained by modifying surfaces of a plurality of nanoparticles of $Al_2O_3$ with oleyl phosphate of $C_{18}H_{37}O_4P$ and coordination bonds are formed between the Al element and the O element, and then dispersing the modified nanoparticles in an organic monomer, and the nanocomposite material has an index of refraction greater than 1.8;
   forming a first inorganic layer on the nanocomposite layer;
   forming an organic layer on the first inorganic layer; and
   forming a second inorganic layer on the organic layer;
   wherein the organic monomer includes at least one monomer selected from cyclic olefin, acrylic, epoxy, and silicon-based organic monomer.

2. The method for manufacturing the flexible OLED display according to claim 1, wherein the nanocomposite layer has a thickness ranging from 10 nm to 100 μm.

3. The method for manufacturing the flexible OLED display according to claim 1, wherein the organic layer includes at least one material selected from acrylate, hexamethyldisiloxane, polyacrylate, polycarbonate, and polystyrene.

4. The method for manufacturing the flexible OLED display according to claim 1, wherein the organic layer has thickness ranging from 1 μm to 20 μm.

5. The method for manufacturing the flexible OLED display according to claim 1, wherein the first inorganic layer has a thickness ranging from 100 μm to 2 μm.

6. The method for manufacturing the flexible OLED display according to claim 1, wherein the first inorganic layer includes at least one material selected from zircoaluminate, graphene, aluminum oxide, zirconium dioxide, zinc peroxide, silicon nitride, SiCN, $SiO_x$, titanium dioxide, diamond-like carbon.

7. A method for manufacturing a flexible organic light-emitting diode (OLED) display, comprising:
   forming an organic light-emitting display layer on a flexible substrate;
   coating a nanocomposite material on the organic light-emitting display layer to form a nanocomposite layer, wherein the nanocomposite material is obtained by modifying surfaces of a plurality of nanoparticles of $Al_2O_3$ with oleyl phosphate of $C_{18}H_{37}O_4P$ and coordination bonds are, formed between the Al element and the O element, and then dispersing the modified nanoparticles in an organic monomer, and the nanocomposite material has an index of refraction greater than 1.8; and forming a first inorganic layer on the nanocomposite layer.

8. The method for manufacturing the flexible OLED display according to claim 7, wherein the organic monomer includes at least one monomer selected from cyclic olefin, acrylic, epoxy, and silicon-based organic monomer.

9. The method for manufacturing the flexible OLED display according to claim 7, wherein the nanocomposite layer has a thickness ranging from 10 nm to 100 μm.

10. The method for manufacturing the flexible OLED display according to claim 7, wherein the method further comprises:

forming an organic layer on the first inorganic layer; and
forming a second inorganic layer on the organic layer.

11. The method for manufacturing the flexible OLED display according to claim 10, wherein the organic layer includes at least one material selected from acrylate, hexamethyldisiloxane, polyacrylate, polycarbonate, and polystyrene.

12. The method for manufacturing the flexible OLEO display according to claim 10, wherein the organic layer has thickness ranging from 1 μm to 20 μm.

13. The method for manufacturing the flexible OLED display according to claim 7, wherein the first inorganic layer has a thickness ranging from 100 nm to 2 μm.

14. The method for manufacturing the flexible OLEO display according to claim 7, wherein the first inorganic layer includes at least one material selected from zircoaluminate, graphene, aluminum oxide, zirconium dioxide, zinc peroxide, silicon nitride, SiCN, $SiO_x$, titanium dioxide, diamond-like carbon.

15. A flexible organic light-emitting diode (OLED) display, comprising:

a flexible substrate;
an organic light-emitting display layer disposed on the flexible substrate;
a nanocomposite layer disposed on the organic light-emitting, display layer; wherein the nanocomposite layer includes a material obtained by modifying surfaces of a plurality of nanoparticles of $Al_2O_3$ with oleyl phosphate of $C_{18}H_{37}O_4P$ and coordination bonds are formed between the Al element and the O element, and then dispersing the modified nanoparticles in an organic monomer, and the nanocomposite material has an index of refraction greater than 1.8; and
a first inorganic layer disposed on the nanocomposite layer.

16. The flexible OLED display according to claim 15, herein the organic monomer includes at least one monomer selected from cyclic olefin, acrylic, epoxy, and silicon-based organic monomer.

17. The flexible IDLED display according to claim 15, wherein the nanocomposite layer has a thickness ranging from 10 nm to 100 μm.

* * * * *